United States Patent [19]

Shudo et al.

[11] 4,226,834

[45] Oct. 7, 1980

[54] LATERAL PULLING GROWTH OF CRYSTAL RIBBONS AND APPARATUS THEREFOR

[75] Inventors: Taro Shudo, Tokyo; Bosshi Kudo, Nagareyama; Yasushi Tamai, Noda, all of Japan

[73] Assignees: Mitsubishi Kinzoku Kabushiki Kaisha; Japan Silicon Co., Ltd., both of Tokyo, Japan

[21] Appl. No.: 864,745

[22] Filed: Dec. 27, 1977

Related U.S. Application Data

[62] Division of Ser. No. 739,632, Nov. 8, 1976, abandoned.

[30] Foreign Application Priority Data

Nov. 14, 1975 [JP] Japan .................................. 50-136841

[51] Int. Cl.² ............................................. B01J 17/18
[52] U.S. Cl. ............................. 422/249; 156/DIG. 97
[58] Field of Search ................. 156/617 SP, DIG. 97, 156/DIG. 96, DIG. 88; 422/249; 261/44 B, DIG. 13

[56] References Cited

U.S. PATENT DOCUMENTS

| | | | |
|---|---|---|---|
| 3,086,758 | 4/1963 | Greene | 261/44 B |
| 3,124,489 | 3/1964 | Vogel | 156/DIG. 96 |
| 3,293,002 | 12/1966 | Spielmann | 156/DIG. 88 |
| 3,353,914 | 11/1967 | Pickar, Jr. | 156/617 SP |
| 3,370,927 | 2/1968 | Faust | 156/DIG. 97 |
| 3,759,671 | 9/1973 | Bleil | 156/DIG. 97 |
| 4,130,611 | 12/1978 | Brand | 261/DIG. 13 |

FOREIGN PATENT DOCUMENTS 1130414  5/1962  Fed. Rep. of Germany ..... 156/617 SP

OTHER PUBLICATIONS

Bleil, J. of Crystal Growth, vol. 5, 1969, pp. 99–104.

Primary Examiner—Hiram H. Bernstein
Attorney, Agent, or Firm—Frishauf, Holtz, Goodman & Woodward

[57] ABSTRACT

The lateral pulling growth of a thin and wide crystal ribbon is established by laterally pulling the crystal ribbon from the melt of a crystalline substance having the same crystal structure as that of the crystal ribbon with a gaseous cooling medium blown over the surfaces of the melt and the grown crystal.

3 Claims, 5 Drawing Figures

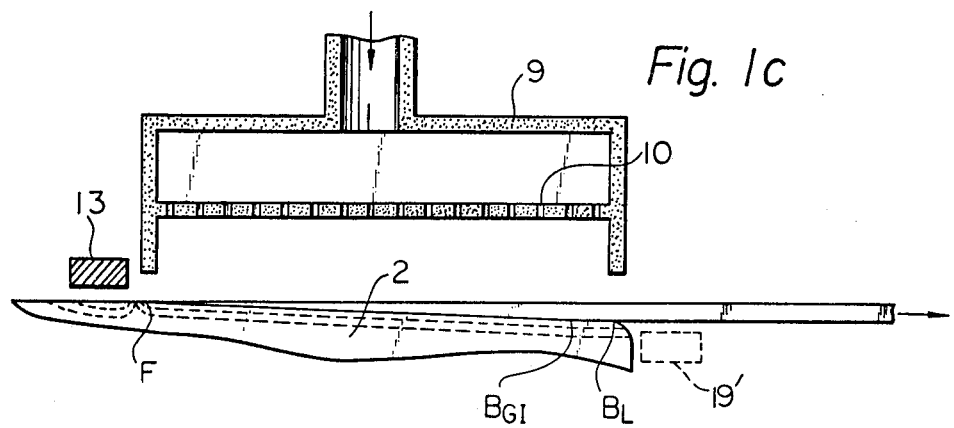
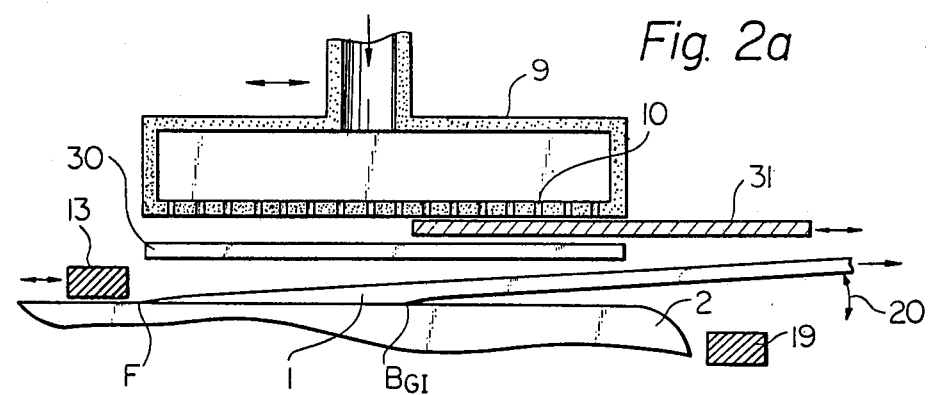
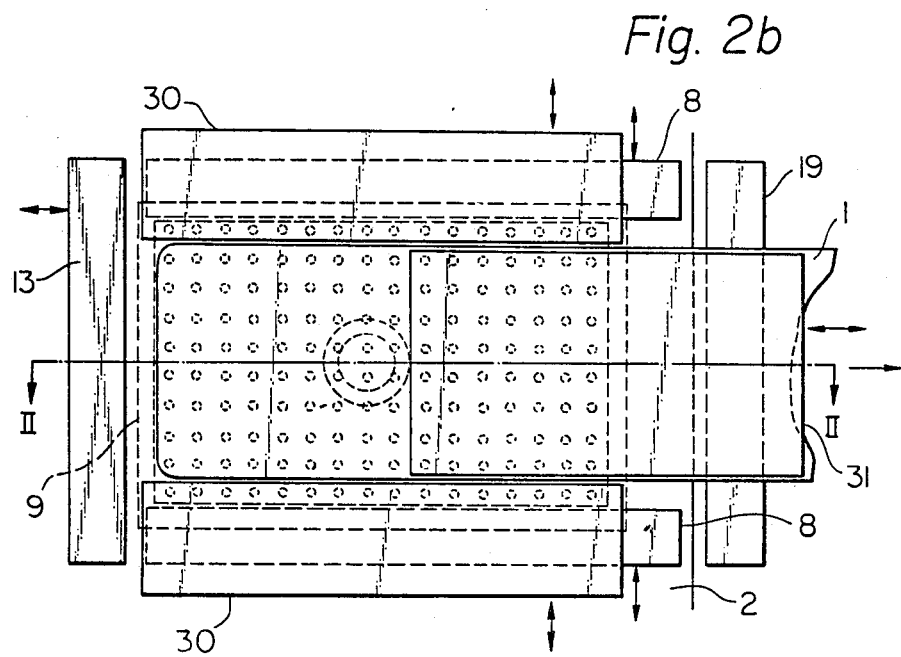

LATERAL PULLING GROWTH OF CRYSTAL RIBBONS AND APPARATUS THEREFOR

This is a division, of application Ser. No. 739,632, filed Nov. 8, 1976 and now abandoned.

RELATED APPLICATION

This application is related to application Ser. No. 705,353 filed July 14, 1976.

This invention relates to the lateral pulling growth of a crystal ribbon, which can successfully be practiced on a commercially large scale.

Crystal ribbons which may satisfy the specifications required for commercial thin crystal ribbons should be wide and uniform in width, thin and uniform in thickness and have flat upper and/or lower surfaces, and in the case of a single crystal they should be free as possible of gross defects and other defects such as dislocations, and moreover, in certain cases, they have to be completely free of dislocation.

Thus, according to the present invention, such wide and thin crystal ribbons may be mass-produced on a commercial scale.

PRIOR ART

Recently, U.S. Pat. No. 3,681,033 and U.S. Pat. No. 3,031,275 have proposed the horizontal growth of crystal ribbons. U.S. Pat. No. 3,681,033 granted to Bleil, for example, discloses a method of horizontally growing a crystal ribbon from a seed crystal, which comprises maintaining a melt of a crystalline substance in a crucible with the height of the melt kept above the edge of the crucible, holding the seed crystal in contact with the surface of said melt to melt the surface thereof slightly, and then horizontally pulling said seed while contacting the upper surface of the growing crystal ribbon with a solid heat sink thereby to produce a flat crystalline ribbon of predetermined thickness.

According to this process, the solidification heat generated at the crystal growing interface between the crystal body and the melt as the crystal is growing is removed perpendicularly from the upper surface of the seed and crystal ribbon grown, and thereby a thin and widespread cooled surface layer is easily formed on the surface of the melt. Thus, in the cases of ice and Ge, crystal ribbons of relatively large width are obtained rather successfully.

However, this process uses a solid body as a heat sink (Teflon for crystallizing crystal ribbons of ice and graphite for germanium), and it results in variation of cooling effect due to the imperfect solid-solid contact, so that it is extremely difficult to precisely control and adjust the contour of the crystal growing domain. Variation in size of the resultant crystal ribbon is inevitable. On the other hand, the thermal stress is so frequently introduced into the crystal growing domain that the generation and multiplication of dislocation is also inevitable, resulting in crystal ribbons of lower quality. Moreover, this process is not so practical nor effective as to realize fast crystallization of ribbons.

Bleil also suggests in another paper, for the purpose of realizing uniform crystal growth, "soft" cooling through radiation only or by means of a gaseous medium which is filled between the solid heat sink and the upper surface of the crystal growing domain. In any case, the removal of heat of solidification is principally dominated by the heat conduction of the solid body and less effective. It is supposed, therefore, that the crystal growth velocity of the Bleil patent is about 3 mm/min at the most.

The horizontal crystal growth techniques, therefore, have never been practiced on a commercial scale, because of the lower quality of the resultant crystal ribbon and its low growth rate compared to those of the conventional ones.

In addition, according to the Bleil patent, the solid heat sink is contacted with the upper surface of the seed crystal prior to the contact of the seed with the melt surface, for the purpose of preventing the contamination derived from the reaction between the surface of the heat sink and the chemically active melt at an elevated temperature, or the precipitation of the melt onto the surface of the heat sink, resulting in frequent interruptions of operation. Thus, the Bleil process cannot be conducted continuously in a stable manner.

BRIEF DESCRIPTION OF THE INVENTION

It is a primary object of this invention to provide a method of lateral pulling growth of crystal ribbons, which can be practiced on a commercial scale.

It is a secondary object of this invention to provide crystal ribbons satisfying the requirements for commercial products of crystal ribbon, which are wide and uniform in width, thin and uniform in thickness, of flat principal surfaces, and of an improved crystallinity.

It is another object of this invention to provide a practical method of laterally growing crystal ribbons at higher speed by effectively removing the solidification heat generated at the crystal growing interface, which makes a small angle with respect to the pulling direction.

It is still another object of this invention to provide a practical method of laterally growing crystal ribbons, which can exclude contamination by foreign material frequently found in the conventional crystal ribbons.

It is a further object of this invention to provide a practical method of lateral pulling growth of crystal ribbons, in which the operation can be stabilized by making possible the adjustment of the geometry of the crystal growing interface (width and length) during operation.

It is a still further object of this invention to provide an apparatus with which the lateral pulling growth of crystal ribbons of the invention can successfully be practiced.

The other objects and advantages of this invention will be apparent from the following description of the invention.

DETAILED DESCRIPTION OF THE INVENTION

The present invention provides a method of growing a thin crystal ribbon which comprises laterally pulling the crystal ribbon from the melt of a crystalline substance having the same crystal structure as that of the crystal ribbon, while blowing a gaseous cooling medium over the upper surface of the crystal growing domain.

The present invention also provides a method of growing a thin crystal ribbon which comprises laterally pulling the crystal ribbon from the melt of a crystalline substance having the same crystal structure as that of the crystal ribbon, while blowing a gaseous cooling medium over the crystal growing domain from a cooling means provided over the melt surface, and adjusting the position and contour of the crystal growing domain by controlling the temperature of the melt surrounding the crystal growing domain to above the melting point thereof.

The present invention further provides an apparatus for growing a thin crystal ribbon by laterally pulling the crystal ribbon from the melt of a crystalline substance having the same crystal structure as that of the crystal ribbon, which comprises means for heating and containing the melt, means for cooling the melt by blowing a gaseous cooling medium over the upper surface of the crystal growing domain through a plurality of nozzles provided above the melt surface, and means for adjusting the position and contour of the crystal growing domain by controlling the temperature of the melt surrounding the crystal growing domain to above the melting point thereof.

The cooling gaseous medium of the present invention may be any one which is chemically inert to the melt of the crystalline substance. In case of silicon, the medium is selected from the group consisting of argon, hydrogen, helium and a mixture thereof.

Thus, the invention encompasses the lateral pulling growth of a crystal ribbon, which is carried out by pulling laterally the crystal ribbon from the melt of the same crystalline substance under precise heat control, while blowing a gaseous cooling medium over the melt surface. A heating furnace to be used for the lateral pulling growth of the crystal ribbon may comprise a crucible or container holding the melt of the crystalline substance, a heating means for heating the crucible, a pulling mechanism for laterally pulling the crystal ribbon from the melt surface through a pulling port of the furnace, and a chamber for housing the members above, which comprises a cooling wall defining an inert atmosphere and means for absorbing heat exhausted from the furnace.

According to the invention, therefore, a crystalline substance is heated at a temperature above the melting point thereof to provide a melt of the substance, a seed crystal attached to the tip of the pulling mechanism is sent laterally into the furnace and melted back slightly in contact with the melt surface under precise heat control, which is established by adjusting the heating and cooling, and then the seed crystal is pulled out of the furnace through the pulling mechanism to provide a crystal ribbon having desired thickness, width and crystal structure. More particularly, according to the invention, the cooling is carried out by blowing a gaseous cooling medium over the melt surface of the crystalline substance as well as the upper surface of the crystal ribbon grown. That is, the gaseous cooling medium is blown over the upper surface of the crystal growing domain. Preferably, the gaseous medium for cooling is applied throughout the overall operation of the pulling growth of the crystal ribbons. The cooling may be initiated just before contacting the seed crystal with the melt surface and after that the cooling is continued in the course of the process operation which includes seeding, growth commencement, growth acceleration and maximum constant rate growth.

The cooling means of the invention may comprise a conduit and a plurality of nozzles, through which a gaseous medium is blown over the surfaces of the melt and the grown crystal. The cooling rate may easily be changed during the operation by varying the flow rate of the gaseous medium.

The position and contour of the crystal growing domain the lower surface of which defines the crystal growing interface remarkably affects the size and quality of the resulting crystal ribbons. Thus, in another aspect of the invention, the contour and position of the crystal growing domain should be adjusted by controlling the thermal conditions precisely. This can be made possible by adjusting the temperature of the melt surrounding the crystal growing domain. The temperature of the melt surrounding the crystal growing domain, then, may be controlled by sliding the position of the cooling means back and forth in the pulling direction, or by sliding in a suitable direction on the horizon at least one baffle plate provided between the cooling means and the melt surface.

Therefore, according to the invention, the cooling area, i.e. the position and contour of the crystal growing domain can be controlled by adjusting at least one baffle plate provided between the cooling means and the melt surface. The baffle plates are movable in any direction on the horizon so that the position and contour of the cooling area may easily be adjusted. Furthermore, the invention employs a plurality of heating means over and around the crystal growing domain to keep the melt surrounding the crystal growing domain at a temperature above the melting point thereof. Preferably, the heating means provided over and around the crystal growing domain is controlled and adjusted individually and separately so that the precise control of the contour and position of the crystal growing domain can easily be achieved. For example, the heating means positioned over and in front of the front edge may be slidable back and forth in the pulling direction so that the contour of the front edge may be adjusted to a desirable shape. On the other hand, the heating means positioned near both longitudinal sides of the crystal growing domain may also be slidable perpendicularly to the sides so that the width of the crystal growing domain may easily be adjusted. At a pulling port, a heating means may be positioned beneath the crystal ribbon under pulling.

Thus, the present invention provides an improved method for the lateral pulling growth of the crystal ribbons.

In still another aspect of the invention, an apparatus for working out such a method as described hereinbefore is provided, which comprises a heating furnace containing a melt of a crystallie substance having the same crystal structure as that of the crystal ribbon and having a pulling port near the edge thereof, a cooling means having a plurality of nozzles provided above the melt surface, through which a gaseous cooling medium is blown over the upper surface of the crystal growing domain, said cooling means being movable back and forth in the pulling direction.

Preferably, at least one baffle plate is provided between the nozzles and the upper surface of the melt, and the baffle plates are movable in any direction on the horizon, so that the position and contour of the crystal growing domain may easily be adjusted only by sliding the baffle plates to control the area of the cooling area. In addition, at least one heating means may be provided over and around the crystal growing domain, each of which is individually and separately operated and controlled through separate control systems and these heating means are also slidable so as to adjust the position and contour of the crystal growing domain. An additional heating means may be provided beneath the crystal ribbon being pulled. The additional heating means is positioned outside the furnace to heat the lower surface of the crystal ribbon as well as the melt near the pulling port.

BRIEF DESCRIPTION OF THE DRAWINGS

FIG. 1b is a plane view of FIG. 1a;

FIG. 1c is a sectional side view of another embodiment of FIG. 1a, in which the broken lines indicate the isotherms in the melt;

FIG. 2a is a sectional side view diagrammatically showing another embodiment of the invention; and FIG. 2b is a plane view of FIG. 2a.

PREFERRED EMBODIMENT OF THE INVENTION

The invention will be described in more detail in conjunction with the drawings.

Figure 1A:
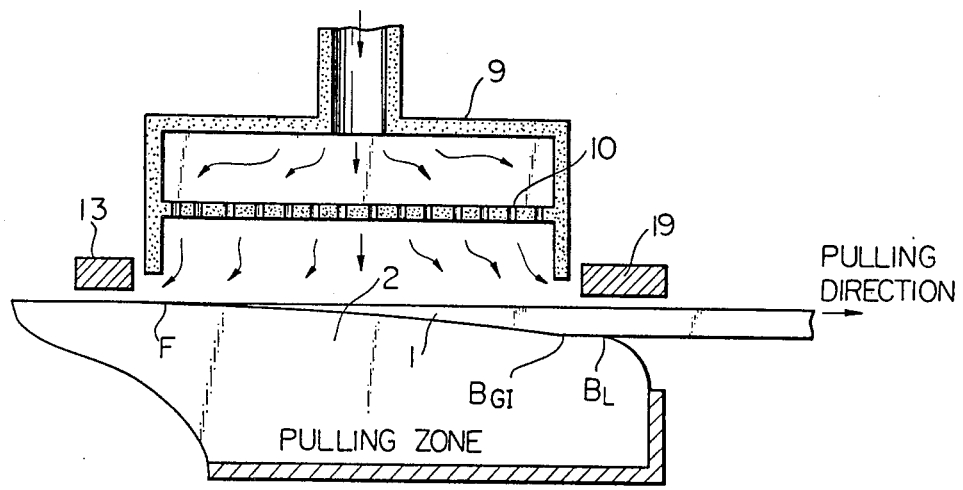
FIG. 1a is a sectional side view diagrammatically showing a portion of the apparatus of the invention.
Figure 1B:
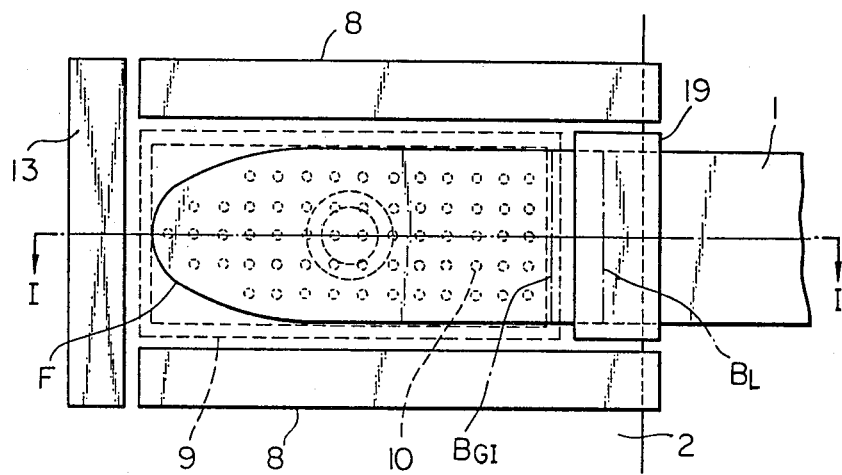

The major portion of the pulling zone of a crystal growing furnace or heating furnace is shown in FIG. 1a to FIG. 1c. As described hereinbefore, a crystalline substance to be grown in accordance with the invention, e.g. semiconducting silicon, which may contain a selected dopant in a given concentration, is contained in a crucible, which may be a crucible of high purity quartz contained within a high purity graphite crucible, or a crucible of the material which is the same as that of the crystal ribbon (e.g. high purity polycrystalline silicon in case the crystal ribbon 1 is semiconducting silicon). The substance within the crucible is kept molten by heating the substance with a heating means (an electrical resistance heater or a high frequency induction heater made of high purity graphite), to which electrical power is supplied from an external source (not shown). Thus, the temperature of the melt 2 is kept above the melting point of the substance and is so controlled that the isotherms may be formed in the area near the free surface of the melt and substantially parallel thereto. A gaseous cooling medium, such as Ar, He, $H_2$ or a mixture thereof is blown over the predetermined area of the melt surface to cool the area below the melting point. The gas is blown through a plurality of nozzles 10 provided with a cooling means 9 positioned just over the melt surface, as shown by arrows in FIG. 1a. The gas is supplied from an external source (not shown) via a conduit (not shown) to the nozzles 10 made of a heat resistant material, such as high purity quartz, which shows less absorption of radiation.

The gaseous cooling medium may be any one which is chemically inert at elevated temperatures to the crystalline substance to be grown in accordance with the invention (e.g. semiconducting silicon).

Care should be taken to precisely adjust the cooling rate of the melt surface, i.e. to cool it so uniformly that the solidification isotherm, i.e. the interface between the crystallized body and the melt may be formed with the depth kept constant in the direction perpendicularly to the pulling direction and with the depth increased to a predetermined level in the pulling direction, as shown in FIG. 1a, and the isotherms may be kept as flat as possible between the front edge F and a given position $B_{GI}$ in the pulling direction, as shown in FIG. 1c.

Such conditions may easily be achieved in accordance with the invention, since the invention employs a gaseous cooling medium, by adjusting the flow rate of the cooling medium, the distance between the nozzles and the melt surface, and the size of the nozzles, as well as the space between the nozzles.

The precise control of the contour of the crystal growing domain is very important, since the width of the crystal growing interface, i.e. the length in the direction perpendicular to the pulling direction may determine the width of the resulting crystal ribbon 1, and, on the other hand, the length of the interface, i.e. the distance between F and $B_{GI}$ in FIGS. 1 may determine the possible maximum pulling speed when conducting high speed crystal growth. For these reasons, the invention provides electrical resistance heaters 8, 13 and 19 above and around the crystal growing domain (i.e. the crystal ribbon grown on the crystal growing interface), and these heaters are heated with electrical power supplied individually from separate electrical sources and control systems (not shown), so that the heat supplied by the overhead heaters may restrict the spreading of the solidification isotherm having a substantially uniform depth in the melt in the direction perpendicular to the pulling direction, which is being formed by cooling the surface area by means of the cooling means 9.

That is, with respect to the control of the width of the domain, the isotherms are so adjusted that they may sharply curve and cross the melt surface at the predetermined positions, which define the two side edges of the domain, respectively. At front edge F, the isotherms are so adjusted that the isotherms may cross the surface of the melt at a relatively small angle as shown in FIG. 1c. The isotherms between the back edge $B_{GI}$ and the back end $B_L$ where the crystal ribbon leaves the melt are so adjusted that they are substantially in parallel to the interface between the lower surface of the crystal ribbon and the melt in the pulling direction, as shown in FIG. 1c.

This is because (1) the surfaces of both sides of the crystal ribbon should preferably be as vertical as possible, since it is desired that the thickness of the resulting crystal ribbon be uniform across the width, i.e. from one side to the other side; (2) the thickness in vertical section of the crystal growing domain formed between the crystal growing interface and the upper surface of the crystal grown should gradually increase in the crystal pulling direction; (3) the crystal growing interface should be as smooth as possible and the solidification heat generated at high speed crystallization should be distributed uniformly over the crystal growing interface; and (4) the distance provided between the back edge $B_{GI}$ and the end $B_L$ may serve to keep constant the thickness of the crystal ribbon grown. The position of the back end $B_L$ may be adjusted by providing heating means 19' instead of the heating means 19, as shown by dotted line in FIG. 1c.

In order to prevent the thermal fluctuation which severely affects the crystallinity of the resulting crystal ribbon, it is desirable that the contour of the crystal growing domain be precisely controlled throughout the process, from the time when initially contacting the seed crystal with the melt surface to the time when pulling the crystal ribbon at constant high speed. In certain cases, the contour of the crystal growing domain of a smaller or larger size than the predetermined size thereof may be used before the pulling rate reaches a predetermined constant high speed.

In this embodiment, too, the gaseous cooling medium is blown over the crystal growing domain throughout the operation. If the gaseous cooling medium is not applied over a substantial length of time, the yield of the crystal ribbon becomes relatively low. If the cooling medium is not applied even for a short period of time, possible thermal fluctuation might bring about polycrystallization, variation in size, generation and multiplication of dislocation and orientation shifts, etc., which cannot be remedied in the operation following thereto. Even if the remedy is possible to some extent, the reduction of yield is not avoidable.

Thus, in a preferred embodiment of the invention, the gaseous cooling medium should be applied throughout the operation from the time when the seed crystal is initially contacted with the melt surface to the time when the crystal ribbon is being pulled at constant high speed.

In FIG. 2a and FIG. 2b, there is shown another embodiment of the invention comprising a cooling means 9 of high purity transparent quartz having a plurality of nozzles 10 through which an inert gas is blown over the melt surface, baffle plates 30 and 31 of high purity quartz which are moved in the pulling direction as well as in the direction perpendicular thereto, as indicated by the arrows, to restrict the blowing area of the gas, and heating means 8 and 13 which heat both the longitudinal sides and the front edge of the crystal growing domain respectively, and are designed to be movable in the directions shown by the arrows, respectively. The crystal ribbon 1 may be pulled from the melt 2 at a small angle with respect to the melt surface. The heating means 19 may be positioned beneath the lower surface of the crystal ribbon so as to prohibit the downward growth of the crystal from the lower surface of the ribbon crystal.

The invention shown in FIGS. 2 is worked out as in the following.

For example, in adjusting, during the operation, the position or length of the domain by shifting the seed crystal or grown crystal ribbon 1 in a direction indicated by the arrow 20, the position of the front edge F can be determined at a predetermined position by adjusting the position of one side of the cooling means 9 facing the crystal growing direction, or the position of the heating means 13 or the heating thereby, the position of the back edge $B_{GI}$ of the crystal growing domain can be determined at a predetermined position by adjusting the position of the baffle plate 31, and the width of the crystal growing domain can be restricted to a desirable one by adjusting the position of the baffle plate 30 or the heating by the heating means 8. Stated from another viewpoint, the width and length of the cooling means can be varied and adjusted as desired by means of baffle plates 30 and 31, respectively. The process parameters mentioned above may be controlled independently. Thus, in accordance with the invention shown in FIG. 2a and FIG. 2b, the contour of the crystal growing domain can precisely be controlled and adjusted to a desirable one during th operation.

There are many ways in which the cooling by blowing an inert gas can be used during the pulling operation. That is, in one embodiment among them, before seeding, the area of the melt surface to be contacted with the seed crystal may be pre-cooled by blowing the gaseous cooling medium over the area. In another embodiment, the seed crystal may be contacted with the melt surface from the lateral direction while cooling the melt surface with the gaseous cooling medium. In still another embodiment, the upper surface of the seed crystal and crystal ribbon may be cooled after the seed crystal is contacted with the melt surface so as to form the crystal growing domain. In a further embodiment, the upper surface of the seed crystal may be cooled before it is contacted with the melt surface.

Obviously, any one of these modifications fall within the sprit and scope of the invention and the appended claims.

It is to be noted that the blowing of the gaseous cooling medium of the invention should also be applied over the melt surface and/or the upper surface of the crystal ribbon while pulling the crystal ribbon laterally.

One of the advantages of the invention is that a uniform cooling of the melt surface area to be cooled may be established due to the employment of a gaseous cooling medium. Thus, according to the invention, the horizontal thermal pattern in the crystal growing domain becomes relatively uniform resulting in the growth of a crystal ribbon having a precisely controlled shape, i.e. wide and uniform in width, thin and uniform in thickness and having flat upper and lower surfaces.

It is also possible to reduce not only the generation of thermal stress, but also the density of crystal defects, such as dislocations, which would be caused and increased by a thermal stress introduced into the crystal growing domain during the process.

Therefore, according to the invention a crystal ribbon having such improved properties can easily be produced continuously.

In addition, when the crystal ribbon is growing at a rate more than 30 mm/min, according to the invention combined with the process disclosed in the prior application Ser. No. 705,353 filed July 14, 1976, the Dash's effect or necking effect (the effect that internal dislocation lines gradually bent to the surface of the crystal and then disappear, and this effect is found in case a thin and long single crystal is pulled at higher speed), which is thought to be essential for producing dislocation-free crystals by the CZ and FZ processes, is always found in the course of the process; thus, any dislocations generated at the starting of pulling at the contact interface between the seed crystal and the melt rapidly disappear resulting in dislocation-free crystals with unexpectedly high yield.

It is also possible to rapidly eliminate dislocations generated in the course of the crystal growth, which were frequently found in the conventional FZ and CZ processes and brought about a reduction of yield.

Comparison of the invention with the horizontal pulling growth of the Bleil patent reveals that the present invention may improve the production of ribbon crystals as well as the yield. In the Bleil patent, due to imperfect solid-solid contact the cooling effect varies from time to time resulting in the temperature fluctuation in the crystal growing domain. Thus, according to the Bleil patent, it is very difficult to precisely control and adjust the contour of the crystal growing domain. The generation of thermal stress is inevitable, too.

Another advantage of the invention is that the cooling efficiency is remarkably improved due to the employment of a gaseous cooling medium. According to the invention, the removal of heat per unit of area of the cooling surface becomes very large, because in the invention a gaseous cooling medium is blown toward the cooling area of the melt surface and/or the upper surface of the crystal ribbon.

Assuming that a crystal ribbon of thickness "t" and width "w" is now growing at a pulling rate "rd", the heat of solidification per unit of area "q" generated at the crystal growing interface extending from the front edge F to the back edge $B_{GI}$ can be expressed by the following equation:

$$q_f = rd \cdot t / L \cdot \rho_c \cdot q_{mp}$$

(wherein $\rho_c$ is the specific gravity of the crystalline material, L is the horizontal length of the crystal growing domain from the front edge F to the back edge $B_{GI}$, and $q_{mp}$ is the latent heat of solidification per unit weight of the crystalline material).

In order to grow the crystal ribbon, it is necessary to remove the heat of solidification $q_f$ and the sensible heat $q_n$ supplied from the heating sources. Therefore, at given "t" and "L", the pulling rate "rd" will be increased as the cooling rate increases. On the other hand, at given "t" and "rd", the crystal ribbon may be grown at a shorter interface.

Thus, according to the present invention, the cooling effect of the melt surface can be improved further compared to the conventional processes, particularly the Bleil patent process. In this respect, even in one particular modification of the Bleil patent in which a gaseous heat-conducting medium is filled between the solid heat sink and the melt surface and/or the upper surface of the crystal, it is apparent that the cooling efficiency is inevitably very low.

A further advantage of the invention is that the contact of the seed crystal to the melt surface is conducted in a very stable manner, since the cooling surface of the melt and/or the upper surface of the crystal can be precooled by blowing a gaseous cooling medium over that portion of the surface areas.

However, according to the Bleil patent process, in which a solid heat sink is used, the direct contact of the cooling means with the melt surface cannot be achieved, since the surface of the heat sink would react with the melt, or even if it does not react, the formation of a solid body between the two surfaces inevitably brings about the formation of a bridge. The solid heat sink is to be contacted with the upper surface of the seed crystal. However, in such as case, the seed crystal might melt down if the cooling rate is too low and, on the other hand, excess precipitation occurs when the cooling rate is too excessive. Thus, the heat control of the heat sink is very difficult.

A still further advantage of the invention is that more precise heat control of the crystal growing domain can easily be achieved by adjusting the flow rate of the gaseous cooling medium and the position and size of the cooling means as well as the positions of the heating means provided over and around the crystal growing domain. For such advantages to be obtained, as described hereinbefore relating to the embodiment shown in FIGS. 2, not only is the cooling means made adjustable in width, length, position and flow rate independently, but also the heating means are made adjustable in position and power. The adjustment of the blowing position and the gas flow rate of the cooling gas, which is essentially required for the stable production of crystal ribbons of high quality, in conjunction with the position of the heating means can easily provide desirable isotherms in the crystal growing domain and a desirable contour of the crystal growing domain.

One effect of such function of this invention is it becomes possible to transfer from pulling at a small angle inclination, in which bridging between the edge of the crucible and the seed at the seeding operation is difficult to occur, to horizontal pulling which is advantageous for precise control of size, or from short growing interface, convenient for low rate growing, to a long one, necessary for high rate growth.

In our experiment, by using the method and apparatus shown in FIGS. 2, a single crystal ribbon of silicon substantially free of crystal defects was continuously obtained at 30 mm/min or more typically 300 mm/min or more without interruption of operation.

However, it is impossible in the Bleil patent to continuously adjust the cooling area in the course of the operation while maintaining the contact of the crystal ribbon with the solid heat sink.

The invention has the many advantages mentioned hereinbefore, and, therefore, can provide improved crystal ribbons which are of commercially used widths, since the cooling means of the invention may easily be scaled up, if a large heating furnace, such as is available in the industry, is used.

What is claimed is:

1. Apparatus for growing a thin single crystal ribbon at high speed by continuously substantially laterally pulling a crystal ribbon of a substance from a melt surface of said substance, a crystal growing interface being formed between said pulled crystal ribbon and the surface of the melt in contact therewith, comprising:
   means for containing said substance;
   means for heating and melting said substance and producing said melt surface on the upper surface of said substance;
   gas cooling means provided with at least one nozzle for blowing a gaseous cooling medium over at least a portion of the upper surface of the melt and over the upper surface of at least a portion of the crystal ribbon above said interface, and defining a crystal growing domain on the surface of the melt in contact with said interface, said cooling means controlling the temperature of the melt surrounding said crystal growing domain to above the melting point thereof so that crystal growth occurs on the surface of said crystal ribbon at said interface, said cooling means being provided above said crystal growing domain and in the vicinity thereof;
   said cooling means being movable in a horizontal direction back and forth substantially in the pulling direction of said crystal ribbon to change the geometry in the horizontal direction of said crystal growing domain during pulling of said crystal ribbon, said cooling means being movable in a direction opposite to the crystal ribbon pulling direction to change a short crystal growing interface to a longer crystal growing interface during pulling of said crystal ribbon.

2. The apparatus of claim 1, wherein said cooling means further comprises at least one baffle plate provided between said at least one nozzle and the upper surface of the melt, said baffle plate being movable in any direction on the horizontal to selectively block the blowing of said gaseous cooling medium on said upper surface of the melt to thereby change the geometry on the horizontal of said crystal growing domain during pulling of said crystal ribbon.

3. The apparatus of either of claims 1 or 2, further comprising at least one heating means provided above and around said crystal growing domain, the position of said at least one heating means being adjustable in a horizontal direction to adjust the geometry on the horizontal of said crystal growing domain during pulling of said crystal ribbon, each of said at least one heating means being individually and separately operated and controlled.

* * * * *